US006338921B1

United States Patent

(12) United States Patent
Bruce et al.

(10) Patent No.: US 6,338,921 B1
(45) Date of Patent: Jan. 15, 2002

(54) MASK WITH LINEWIDTH COMPENSATION AND METHOD OF MAKING SAME

(75) Inventors: James A. Bruce, Williston; David V. Horak, Essex Junction; Randy W. Mann, Jericho; Jed H. Rankin, Burlington; Andrew J. Watts, Essex, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/479,150

(22) Filed: Jan. 7, 2000

(51) Int. Cl.[7] .............................. G03F 1/02; G03F 1/14; B44C 1/22

(52) U.S. Cl. ........................... 430/5; 430/323; 430/327; 216/12; 216/46

(58) Field of Search ............................ 430/5, 323, 327; 216/12, 46

(56) References Cited

U.S. PATENT DOCUMENTS 4,256,514 A 3/1981 Pogge ........................ 148/1.5
5,242,770 A 9/1993 Chen et al. .................... 430/5
5,268,244 A 12/1993 Yoo ............................. 430/5
5,415,951 A 5/1995 Miyazaki ....................... 430/5
5,472,811 A 12/1995 Vasudev et al. ............... 430/5
5,472,812 A 12/1995 Sekine .......................... 430/5
5,620,817 A 4/1997 Hsu et al. ...................... 430/5
5,827,623 A 10/1998 Ishida et al. .................. 430/5

*Primary Examiner*—Richard L. Schilling
(74) *Attorney, Agent, or Firm*—Downs Rachlin & Martin PLLC

(57) ABSTRACT

A mask (50') with linewidth compensation and a method of making same. The mask provides for optimized imaging of isolated patterns (64) and nested patterns (70) present on the same mask. The compensated mask is formed from an uncompensated mask (50) and comprises an upper surface (56) upon which the isolated and nested patterns are formed. The isolated pattern comprises a first segment (76) having first sidewalls (76S). The nested pattern comprises second segments (72) proximate each other and having second sidewalls (72S). A partial conformal layer (86) covers the first segment and has feet (90) outwardly extending a distance d from the first sidewalls along the upper surface. The feet are preferably of a thickness that partially transmits exposure light.

52 Claims, 6 Drawing Sheets

MASK WITH LINEWIDTH COMPENSATION AND METHOD OF MAKING SAME

FIELD OF THE INVENTION

The present invention relates to masks for use in manufacturing devices such as semiconductor integrated circuits and the like, and more particularly relates to such masks having patterns thereon that are compensated in a way that allows for optimized images of the patterns to be printed.

BACKGROUND OF THE INVENTION

Modern day semiconductor devices, such as integrated circuits and the like, are fabricated using photolithographic processes. In a typical photolithographic process, light from an illumination system is passed through a mask having a pattern. The mask is typically a glass substrate, and the pattern is typically opaque and is formed from a metal such as chrome. The light passing through the mask is imaged by a projection optical system onto a wafer coated with a photosensitive material (e.g., photoresist). The mask pattern is thus recorded in the photoresist, and is subsequently developed, thus forming a resist pattern. The resist pattern is then transferred into the wafer by various known deposition, etching and other processes. This process is repeated for various types of masks to form a layered structure in the wafer, ultimately forming a semiconductor device.

In the above process, the pattern on the mask often has a size that is at the resolution limit of the projection optical system. In such a case, though the patterns may have similar dimensions on the mask, diffraction from the mask and the limited aperture of the lens result in the photoresist pattern having a different size. A well-known example of this phenomenon is the problem of isolated patterns printing larger than nested patterns of the same size. This size differential creates problems in obtaining functional devices, since it is difficult to choose the proper exposure for obtaining linewidths that are within the device specifications.

There are a variety of known techniques for compensating mask patterns so that the corresponding resist patterns print in a desired manner. For example, U.S. Pat. No. 5,827,623 discloses a half-tone phase-shift mask designed to compensate for proximity effects. Also, U.S. Pat. No. 5,242,770 discloses a mask for photolithography that reduces proximity effects by having "intensity leveling bars," i.e., lines less than the resolution limit of the projection optical system, arranged adjacent the isolated edges of a mask pattern so as to make the isolated feature have the same intensity profile as nested features. However, each of the above-mentioned prior art masks are complicated and costly to manufacture, and do not always produce the desired results.

SUMMARY OF THE INVENTION

The present invention relates to masks for use in manufacturing devices such as semiconductor integrated circuits and the like, and more particularly relates to such masks having patterns thereon that are compensated in a way that allows for optimized images of the patterns to be printed.

A first aspect of the invention is a method of making a mask that is compensated to allow for optimized images of patterns thereon to be formed on a photosensitive substrate. The method involves providing a substrate transparent to light of a first wavelength. The substrate has an upper surface on which is formed (i) a first segment having first sidewalls, and (ii) a second segment having second sidewalls. Next, a conformal layer is deposited atop the upper surface so as to conformally cover the first segment and the second segment. Finally, the conformal layer is removed so as to leave a partial conformal layer surrounding the first segment. The partial conformal layer extends outwardly from the first sidewalls a distance d, as measured in a direction parallel to the upper surface.

A second aspect of the invention is a method of making a mask that is compensated to allow for optimized images of patterns thereon to be printed on a photosensitive substrate. The method involves providing a substrate transparent to light of a first wavelength. The substrate has an upper surface on which is formed (i) a first segment having first sidewalls and (ii) a second segment having second sidewalls. Next, a conformal layer is deposited so as to conformally cover the first segment and the second segment. Then, portions of the conformal layer are removed so as to provide first spacers adjacent the first sidewalls and second spacers adjacent the second sidewalls. Finally, the second spacers are removed from the second sidewalls.

A third aspect of the invention is a mask compensated for optimized imaging of first and second patterns. The mask comprises an upper surface having first patterns, each comprising a first segment having first sidewalls, and second patterns, each comprising a second segment having second sidewalls. The mask also includes spacers adjacent the first sidewalls of the first segments and extending a distance d from the first sidewalls of the first segment.

DETAILED DESCRIPTION OF THE INVENTION

The present invention relates to masks for use in manufacturing devices such as semiconductor integrated circuits and the like, and more particularly relates to such masks having patterns thereon that are compensated in a way that allows for optimized images of the patterns to be printed.

A first aspect of the present invention is now described with reference to flow diagram 10 of FIG. 1 and steps 12–18 therein, and also to FIGS. 2–5.

Figure 1:
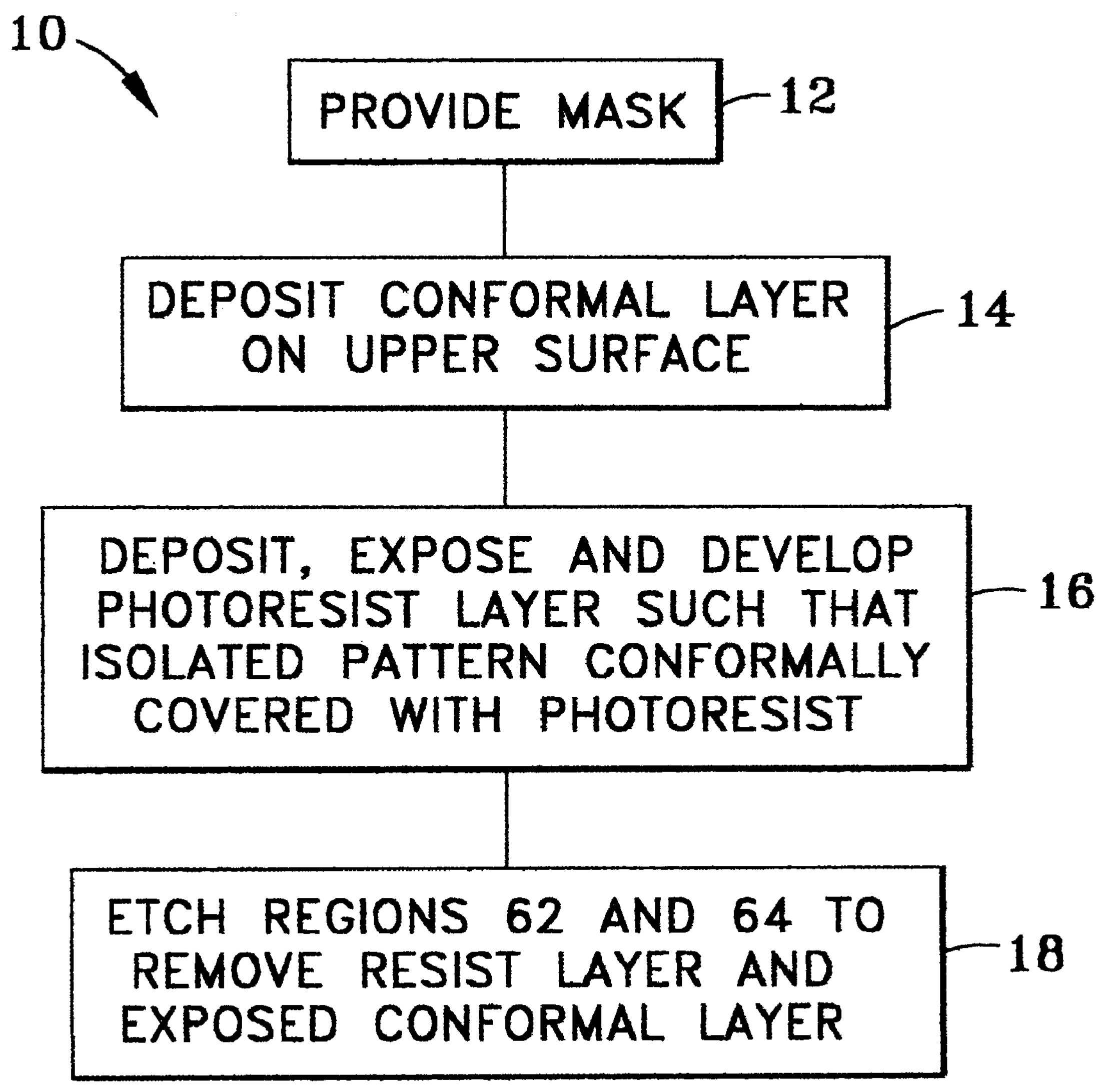
FIG. 1 is a flow diagram outlining the method steps for performing a first aspect of the present invention.
Figure 2:
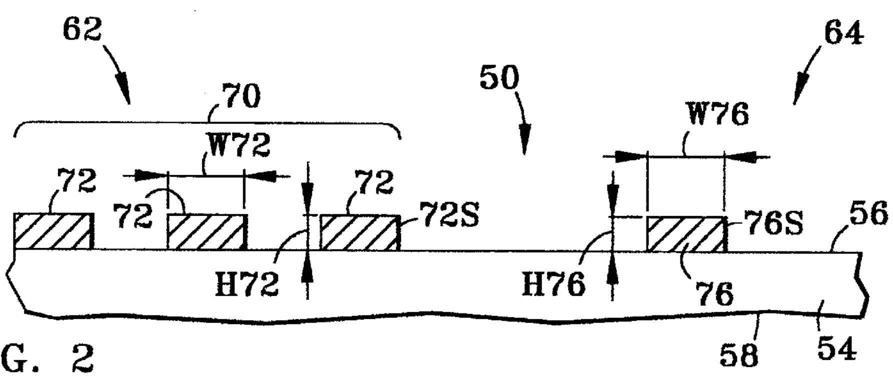
FIG. 2 is a cross-sectional diagram of the mask of the present invention according to step 12 of the flow diagram of FIG. 1.

First, with reference to FIGS. 1 and 2, in step 12, an uncompensated mask 50 comprising a substrate 54 transparent to the wavelength of the exposure light is provided. For ultraviolet exposure wavelengths such as 248 nm, a preferred material for substrate 54 is quartz or fused silica. Substrate 54 has an upper surface 56 and a lower surface 58 and includes first and second regions 62 and 64. Mask 50 further includes on upper surface 56 in first region 62 a nested pattern 70 having pattern segments 72 each having sidewalls 72S of height H72 and width W72, and in second region 64 an isolated pattern segment 76 having sidewalls 76S of height H76 and width W76. Patterns 70 and 76 are preferably opaque to the wavelength of the exposure light and may be formed from a metal, such as chromium, deposited as a thin film on upper surface 56 of substrate 54. Pattern segments 72 are proximate each other, i.e., typically within a distance of 5 times the width W72 of one of pattern segments 72.

Figure 3:
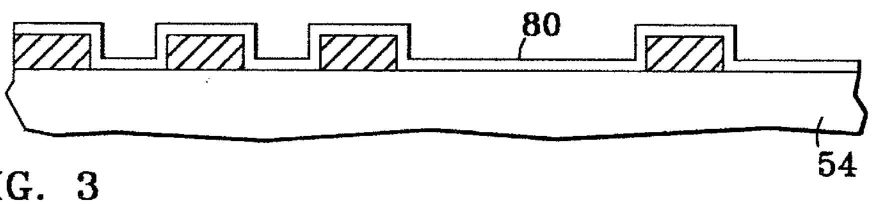
FIG. 3 is a cross-sectional diagram of the mask of the present invention according to step 14 of the flow diagram of FIG. 1.

With reference now to FIGS. 1 and 3, in step 14, a conformal layer 80 of material is deposited on upper surface 56 of substrate 14. A conformal layer is one that covers the horizontal and vertical surfaces (i.e., sidewalls 70S and 76S) of patterns 70 and 74 in approximately equal thickness. The material making up conformal layer 80 may be any material that is etchable in fluorine-based reactive ion etch (RIE) chemistry, such as molybdenum silicide (MoSi). Alternatively, conformal layer 80 could be made from carbon and etched using an oxygen RIE. Still another alternative would be to make conformal layer 80 from chromium and then etch the layer using a chlorine-based RIE. The thickness of layer 80 is preferably between 50 Å–400 Å.

Figure 4:
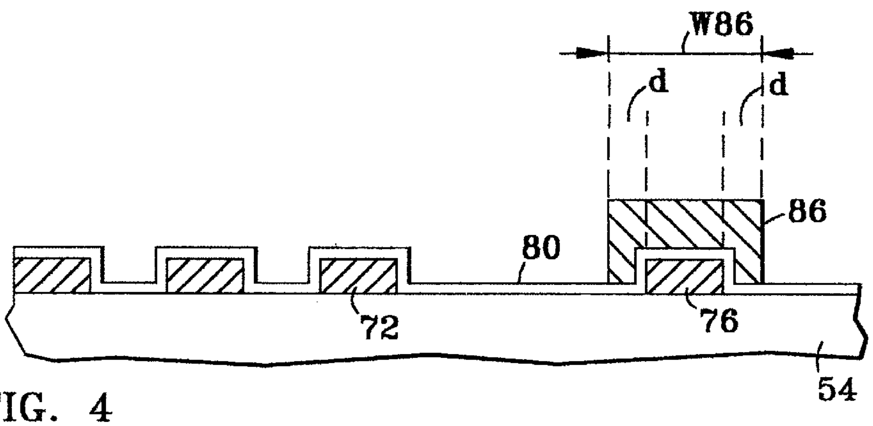
FIG. 4 is a cross-sectional diagram of the mask of the present invention according to step 16 of the flow diagram of FIG. 1.

With reference now to FIGS. 1 and 4, in step 16, a layer 86 of photoresist, preferably ranging in thickness from 1000 Åto 20,000 Å is deposited atop layer 80 and then exposed and developed such that isolated pattern segment 76 is conformally covered with a photoresist cap layer 86, as shown. Cap layer 86 has a width W86=W76+d+d, wherein d is the distance on either side of sidewalls 76S of isolated pattern segment 76 from which cap layer 86 extends outwardly.

Figure 5:
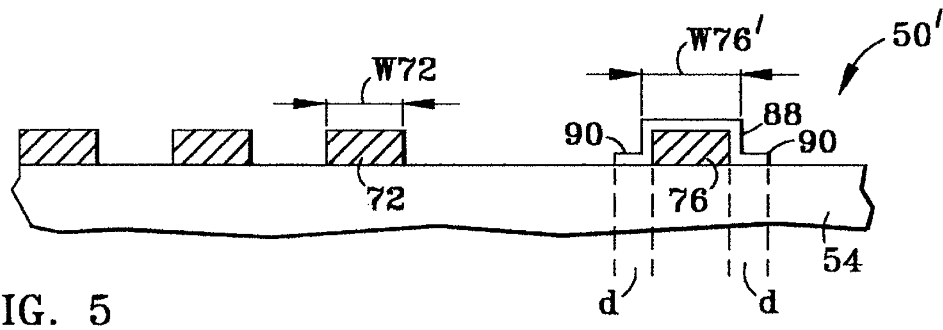
FIG. 5 is a cross-sectional diagram of the mask of the present invention according to step 18 of the flow diagram of FIG. 1.

With reference now to FIGS. 1 and 5, in step 18, a RIE etch is performed using $SF_6$ or any fluorine-based RIE chemistry, and the remaining resist layer 86 and the exposed portion of conformal layer 80 is removed. This leaves a partial conformal layer 88 (i.e., a conformal cap layer) of conformal layer 80 conformally arranged over and on either side of isolated pattern 76. Partial conformal layer 88 typically has feet 90 that extend outwardly a distance d from sidewalls 76S over upper surface 56 of substrate 54. Distance d ranges from just slightly greater than the thickness of partial conformal layer 88, i.e., at a minimum, about 50 Å, to the distance between sidewall 76S and an adjacent feature, such as the most proximate sidewall 72S of an adjacent segment 72. In some cases, it may be desirable not to provide feet 90, with the result that distance d is equal to the thickness of partial conformal layer 88 on sidewalls 76S, i.e., preferably 50 Å–400 Å.

Thus, after performing step 18, the result is a compensated mask 50' having an isolated pattern 76 with an effective width W76' that is effectively wider than the width W72 of nested pattern segments 72. Mask 50' allows for the printing of isolated and nested features with a reduced or eliminated proximity effect.

For isolated pattern segment 76 having height H76, for example, of 800 Å, layer 80 immediately adjacent sidewalls 76S will be about 1000–1200 Å thick (as measured perpendicularly to surface 56), and thus substantially opaque. On the other hand, feet 90 will be 50–400 Å thick, and can range in transparency from 0% to 100%. Accordingly, feet 90 can provide for a gray-scale edge to otherwise opaque isolated pattern 76. The choice of material for layer 80 will often be influenced by the extent of desired gray scale masking. When conformal layer 80, and hence feet 90, is made from MoSi, light transmission may be modulated as desired by the addition of nitrogen or by varying the ration of Mo to Si ($Mo_xSi_y$).

Figure 6:
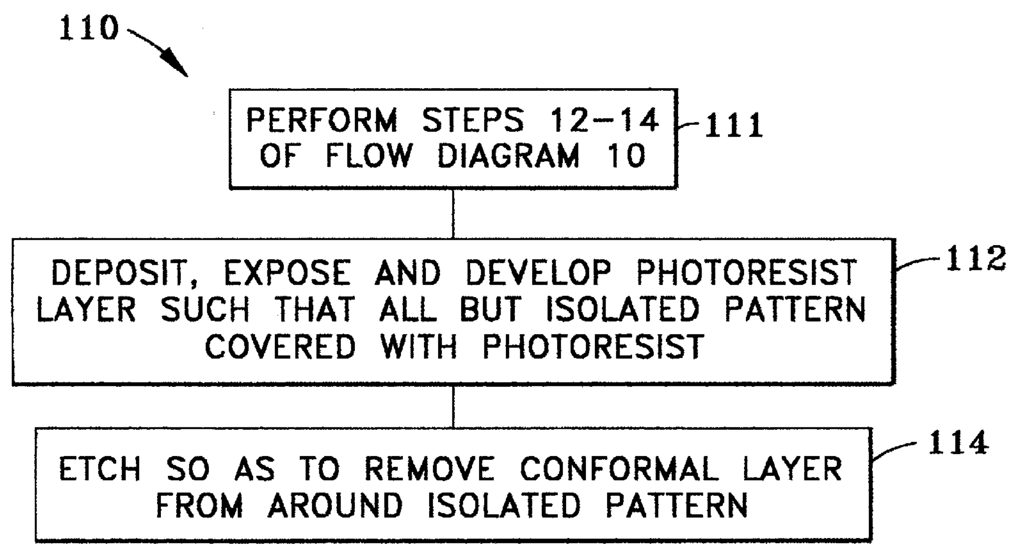
FIG. 6 is a flow diagram outlining the method steps for performing a second aspect of the present invention.
Figure 7:
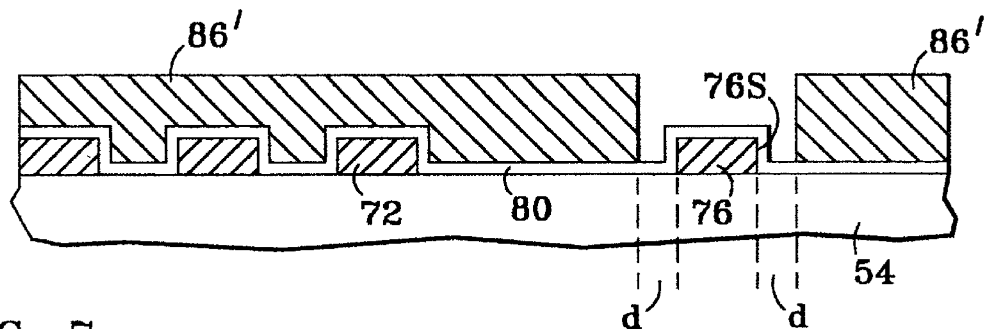
FIG. 7 is a cross-sectional diagram of the mask of the present invention according to step 112 of the flow diagram of FIG. 6.
Figure 8:
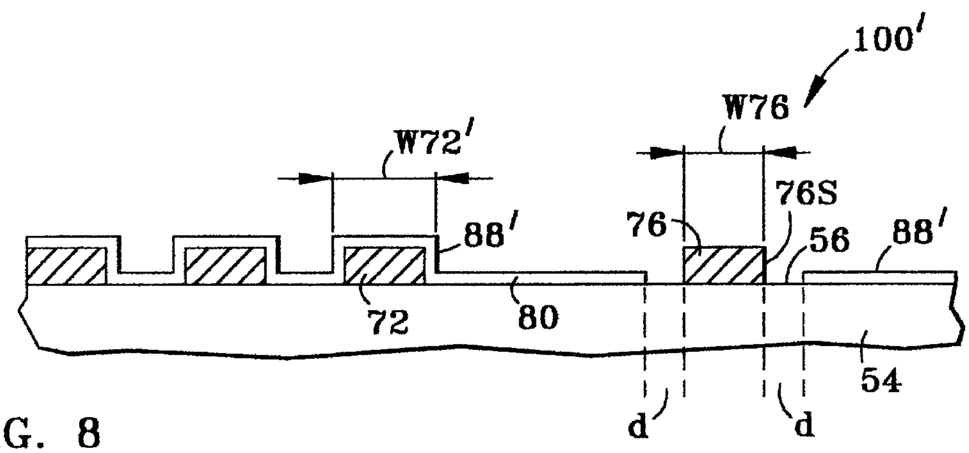
FIG. 8 is a cross-sectional diagram of the mask of the present invention according to step 114 of the flow diagram of FIG. 6.

With reference now to flow diagram 110 of FIG. 6 and to FIGS. 7 and 8, a second aspect of the invention is a compensated mask 100' (FIG. 8) similar to mask 50' as described above, but in which the nested lines have an effective width W72' greater than width W76 of isolated pattern 76. The steps for making mask 100' include steps 12 and 14 of flow diagram 10 of FIG. 1, as indicated by step 111 in the flow diagram of FIG. 6. Next, in step 112, a photoresist layer 86 is deposited atop layer 80 and then exposed and developed. This forms a photoresist cap layer 86' that covers all but isolated pattern 76 and the portion of upper surface 56 within a distance d from sidewall 76S, as shown. Then, with reference to FIGS. 6 and 8, in the next step 114, a RIE etch is performed using $SF_6$ or any fluorine-based RIE chemistry, such that the photoresist cap layer 86' is removed. This leaves a partial conformal layer 88' conformally covering all but isolated pattern 76 and immediately adjacent portions of top surface 56. More particularly, partial conformal layer 88' is spaced a distance d from sidewall 76S. Distance d ranges from zero, i.e., partial conformal layer 88' may confront sidewall 76S, to the distance between sidewall 76S and an adjacent feature, such as the portion of partial conformal layer 88' covering the most proximate sidewall 72S of an adjacent segment 72.

Thus, after performing steps 111, 112 and 114, the result is a compensated mask 100' having a nested pattern with a compensated width W72' that is wider than the width W76 of isolated pattern 76 and the uncompensated width W72 of nested pattern segments 72. Mask 100' allows for the printing of isolated and nested features with a reduced or eliminated proximity effect.

With reference now to flow diagram 160 of FIG. 9 and FIGS. 10–12, a third aspect of the invention is a compensated mask 150' (FIG. 12) similar to mask 50' as described above, but which has spacers formed adjacent sidewalls 76S of isolated pattern 76. The steps for making mask 150' include steps 12–14 of flow diagram 10 of FIG. 1 and steps 162–166 of flow diagram 160 of FIG. 9, as depicted in FIGS.

10–12. After performing steps 12–14 of the flow diagram 10, as described above and indicated by step 161, in the next step 162, conformal layer 80 is etched so as to form spacers 152 and 154 immediately adjacent sidewalls 72S and 76S, respectively, of pattern segments 72 and 76. The anisotropic RIE taught in U.S. Pat. No. 4,256,514 to Pogge, which is incorporated herein by reference, may be used to form spacers 152 and 154. Spacers 152 and 154 have outer edges 152S and 154S, respectively, that are typically sloped. An angle θ is formed by outer edge 152S and sidewall 152 or by outer edge 154S and sidewall 154. Angle θ typically ranges from between 0 degrees and 45 degrees.

Figure 9:
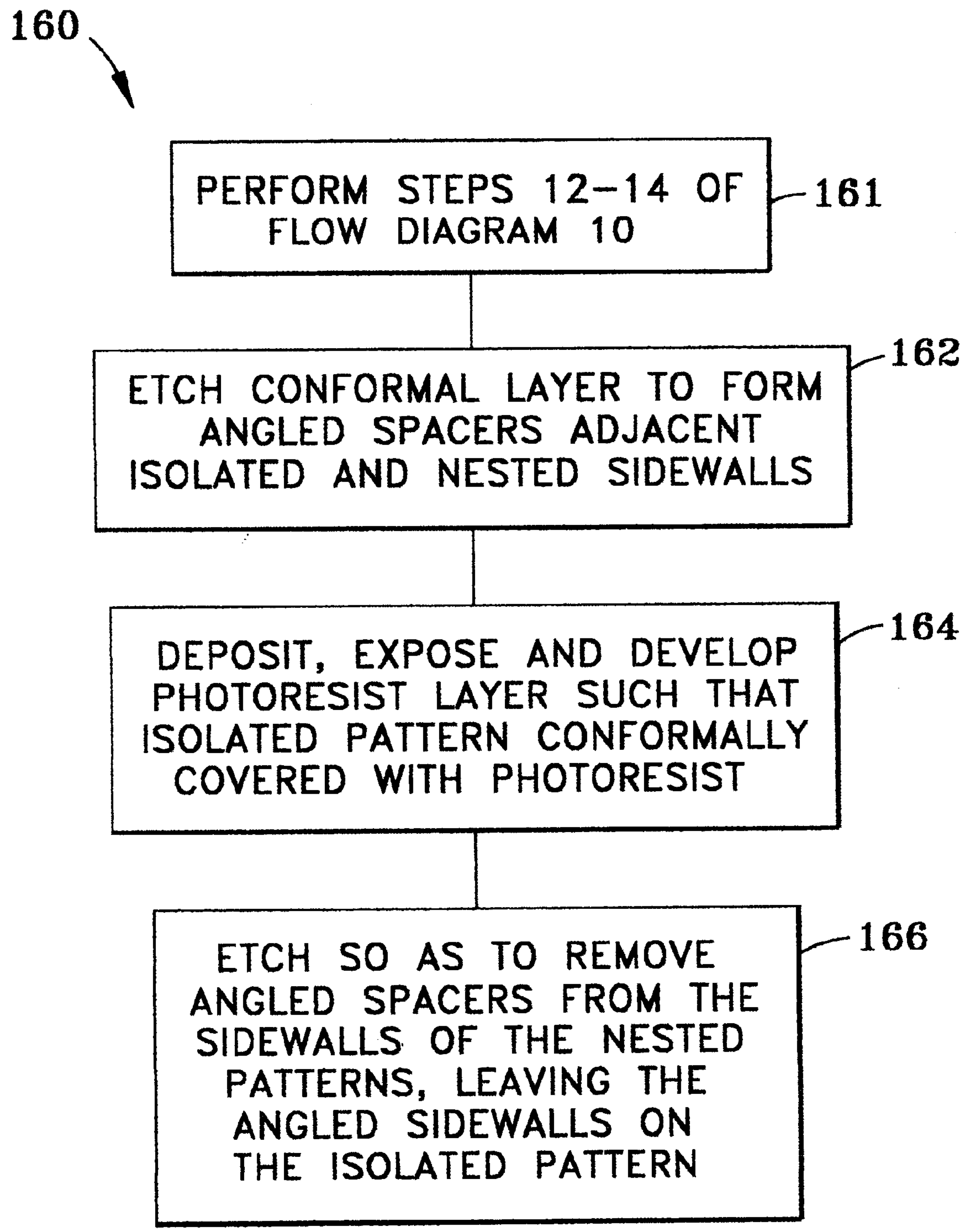
FIG. 9 is a flow diagram outlining the method steps for performing a third embodiment of the present invention.
Figure 10:
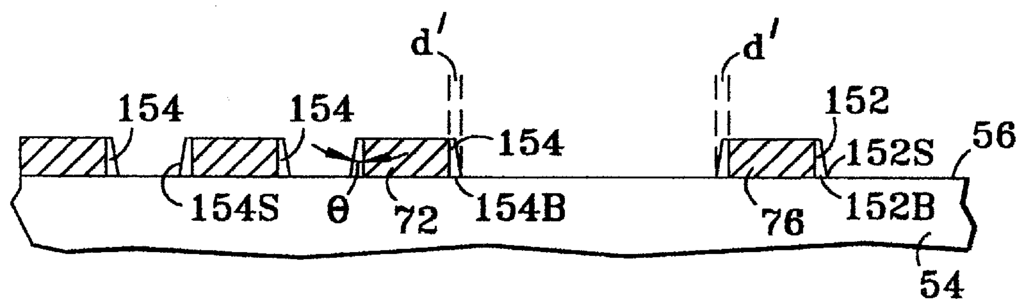
FIG. 10 is a cross-sectional diagram of the mask of the present invention according to step 162 of the flow diagram of FIG. 9.
Figure 11:
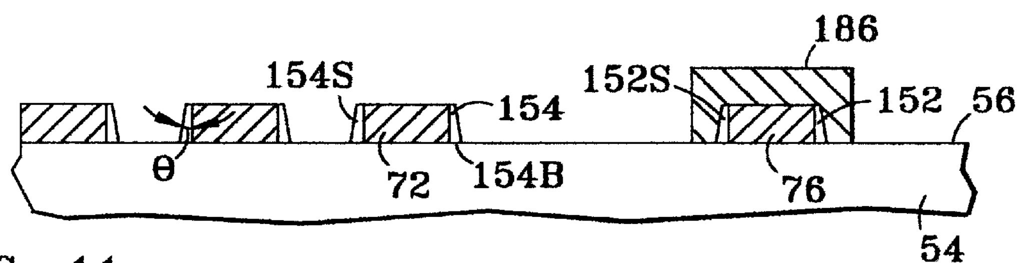
FIG. 11 is a cross-sectional diagram of the mask of the present invention according to step 164 of the flow diagram of FIG. 9.
Figure 12:
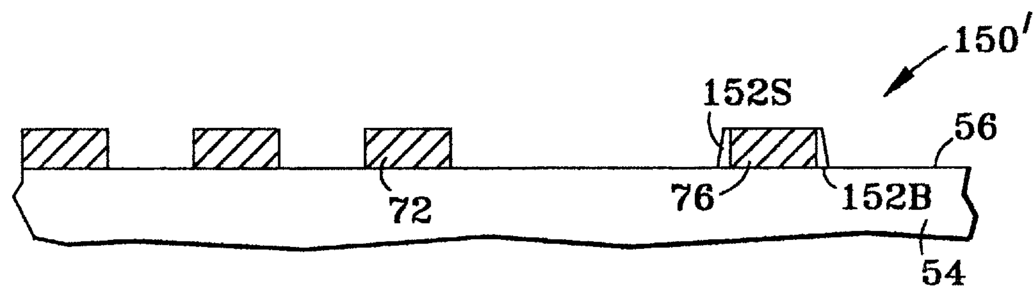
FIG. 12 is a cross-sectional diagram of the mask of the present invention according to step 166 of the flow diagram of FIG. 9.

Next, with continuing reference to FIG. 9 and also to FIG. 11, in step 164, photoresist cap layer 186 is deposited atop layer 80 and then exposed and developed such that isolated pattern segment 76 and spacers 152 are conformally covered, as shown. Spacer 152 has a base 152B that extends along upper surface 56 a distance d'. Distance d' ranges from as little as 50 Å to the distance between the vertical sidewall of segment 76 (inside of spacer 152S) to the most proximate vertical sidewall of an adjacent segment 72. Next, with reference to FIG. 12, in step 166, a RIE etch is performed using $SF_6$, any fluorine-based RIE chemistry, or a suitable wet etch, so as to remove spacers 154 from sidewalls 72S of pattern segments 72, and remove resist cap layer 186 covering isolated pattern segment 76 and isolated spacers 152, so that spacers 152 remain on isolated pattern segment 76 only.

Mask 150' allows for the printing of isolated and nested features with a reduced or eliminated proximity effect.

Figure 13:
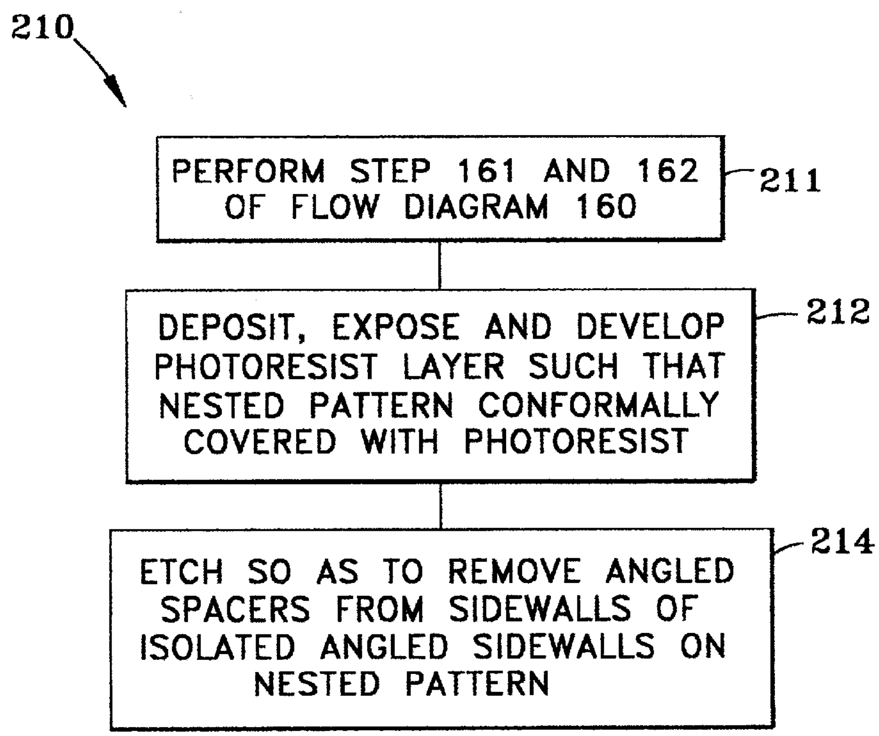
FIG. 13 is a flow diagram outlining the method steps for performing a fourth aspect of the present invention.
Figure 14:
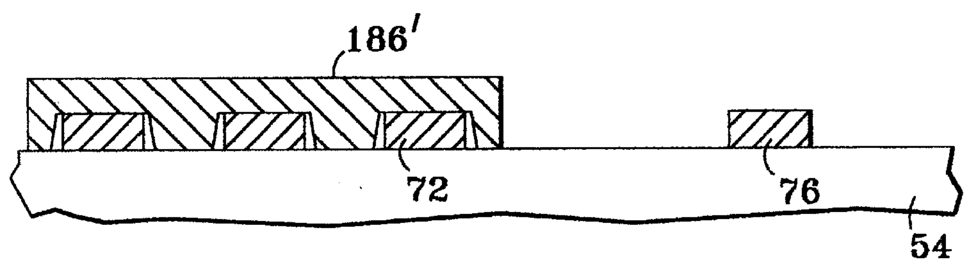
FIG. 14 is a cross-sectional diagram of the mask of the present invention according to step 212 of the flow diagram of FIG. 13.
Figure 15:
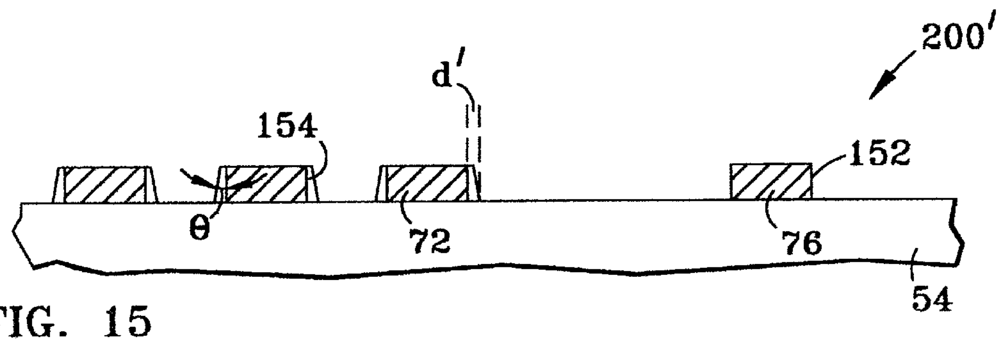
FIG. 15 is a cross-sectional diagram of the mask of the present invention according to step 214 of the flow diagram of FIG. 13.

With reference now to flow diagram 210 of FIG. 13 and FIGS. 14 and 15, a fourth aspect of the invention is a compensated mask 200' similar to masks 150' as described above, but which has spacers 154S only on the nested pattern segments 72 adjacent sidewalls 72S. The steps for making mask 200' include steps 161 and 162 of flow diagram 160 of FIG. 9, as described above and depicted by step 211 in FIG. 13. After performing steps 161 and 162 of flow diagram 160 of FIG. 9, in the next step 212, a layer of photoresist is deposited atop nested pattern 70 and then exposed and developed such that nested pattern 70 is conformally covered with a photoresist cap layer 186', as shown.

Next, with reference to FIG. 15, in step 214, a RIE etch is performed using $SF_6$, any fluorine-based RIE chemistry, or a suitable wet etch, thereby removing spacers 152 from sidewalls 76S of isolated pattern segments 76, and removing photoresist cap layer 186' covering nested pattern 70, so that spacers 154 remain on nested pattern 70 only. As with spacers 152, spacers 154 extend a distance d' that ranges from as little as about 50 Å to the distance between the vertical sidewall 72 (inside of spacer 152S) to the most proximate vertical sidewall of an adjacent segment 76.

An advantage of the present invention is that it can be used to compensate for linewidth variations in the features on a mask so as to bring the overall linewidth variation on the mask into an acceptable range. This also reduces the overall linewidth variation printed on the photosensitive substrate. While the present invention has particular application in the context of masks having isolated and nested features, the invention may be used optimize images of other mask patterns. In this regards, as used in the claims, the term “first segment” is not necessarily limited to an isolated feature and the term “second segment” is not necessarily limited to a nested feature.

The present invention has been described above in connection with various aspects of the invention and preferred embodiments. However, present the invention is not so limited. Rather, the present invention should be considered to have the scope and range of equivalents as set forth in the appended claims.

What is claimed is:

1. A method of making a mask that is compensated to allow for optimized images of patterns thereon to be formed on a photosensitive substrate, comprising the steps of:

a. providing a substrate transparent to light of a first wavelength, said substrate having an upper surface on which is formed (i) a first segment having first sidewalls, and (ii) a second segment having second sidewalls;

b. depositing a conformal layer atop said upper surface so as to conformally cover said first segment and said second segment; and c. removing said conformal layer so as to leave a partial conformal layer surrounding said first segment, said partial conformal layer extending outwardly from said first sidewalls a distance d, as measured in a direction parallel to said upper surface.

2. A method according to claim 1, wherein said step c comprises the steps of forming a photoresist layer atop said conformal layer, selectively exposing said photoresist layer, and selectively developing said photoresist layer so as to form a photoresist cap layer.

3. A method according to claim 1, wherein said conformal layer is selected from the group consisting of molybdenum silicide, carbon and chromium.

4. A method according to claim 1, wherein said conformal layer has a thickness between 50 Å and 400 Å.

5. A method according to claim 2, wherein said photoresist cap layer has a thickness between 1000 Å and 20,000 Å.

6. A method according to claim 1, wherein said partial conformal layer has a first portion that extends substantially parallel to said first sidewalls and one or more feet that extend substantially perpendicular to said first sidewalls.

7. A method according to claim 6, wherein said feet have a thickness between 50 Å and 400 Å.

8. A method according to claim 1, wherein said substrate has a plurality of second segments and said depositing step b includes depositing said conformal layer atop said plurality of second segments.

9. A method according to claim 1, wherein that portion of said partial conformal layer confronting said first sidewalls has a thickness X, further wherein said distance d ranges from X to that distance between said first sidewall with respect to which said distance d is measured and that one of said second sidewalls most proximate said first sidewall.

10. A method according to claim 1, wherein at least one of said first and segments is opaque to said light.

11. A method according to claim 1, wherein said partial conformal layer has a thickness such that said light may be partially transmitted there through.

12. A method of making a mask that is compensated to allow for optimized images of patterns thereon to be formed on a photosensitive substrate, comprising the steps of:

a. providing a substrate transparent to light of a first wavelength and having an upper surface on which is formed (i) a first segment having first sidewalls, and (ii) a second segment having second sidewalls;

b. depositing a conformal layer atop said upper surface so as to conformally cover said first segment and said second segment; and c. removing portions of said conformal layer so as to leave a partial conformal layer surrounding said second segment, said partial conformal layer extending outwardly from said second sidewalls a distance d, as measured in a direction parallel to said upper surface.

13. A method according to claim 12, wherein said step c comprises the steps of forming a photoresist layer atop said conformal layer, selectively exposing said photoresist layer, and selectively developing said photoresist layer so as to form a partial photoresist layer.

14. A method according to claim 12, wherein said conformal layer is selected from the group consisting of molybdenum silicide, carbon and chromium.

15. A method according to claim 12, wherein said conformal layer has a thickness between 50 Å and 400 Å.

16. A method according to claim 13, wherein said partial photoresist layer has a thickness between 1000 Å and 20,000 Å.

17. A method according to claim 12, wherein that portion of said partial conformal layer confronting said second sidewalls has a thickness X, further wherein said distance d ranges from X to that distance between said second sidewall with respect to which said distance d is measured and that one of said first sidewalls most proximate said second sidewall.

18. A method according to claim 12, wherein said partial conformal layer has a thickness such that said light may be partially transmitted there through.

19. A method according to claim 12, wherein at least one of said first and second segments is opaque to said light.

20. A method according to claim 12, wherein said substrate has a plurality of second segments and said depositing step b includes depositing said conformal layer atop said plurality of second segments.

21. A method of making a mask that is compensated to allow for optimized images of patterns thereon to be formed on a photosensitive substrate, comprising the steps of:

a. providing a substrate transparent to light of a first wavelength and having an upper surface on which is formed (i) a first segment having first sidewalls and (ii) a second segment having second sidewalls;

b. depositing a conformal layer so as to conformally cover said first segment and said second segment;

c. removing portions of said conformal layer so as to provide first spacers adjacent said first sidewalls and second spacers adjacent said second sidewalls; and d. removing said second spacers from said second sidewalls.

22. A method according to claim 21, wherein said step c comprises the steps of depositing a photoresist layer atop said conformal layer, selectively exposing said photoresist layer, and selectively developing said photoresist layer so as to form a photoresist cap layer atop said first and second sidewalls.

23. A method according to claim 22, further wherein step c includes the step of etching away portions of said conformal layer not covered by said photoresist cap layer so as to provide said first spacers and said second spacers.

24. A method according to claim 21, wherein said conformal layer is selected from the group consisting of molybdenum silicide, carbon and chromium.

25. A method according to claim 21, wherein said conformal layer has a thickness between 50 Å and 400 Å.

26. A method according to claim 22, wherein said photoresist layer has a thickness between 1000 Å and 20,000 Å.

27. A method according to claim 21, wherein said first spacers extend a distance d', as measured at a base of said first spacers, from adjacent first sidewalls, and said conformal layer has a thickness X, wherein said distance d' ranges from X to that distance between said first sidewall with respect to which said distance d' is measured and that one of said second sidewalls most proximate said first sidewall.

28. A method according to claim 21, wherein said step d includes the steps of providing a photoresist cap layer atop said first sidewalls and removing said spacers adjacent said second sidewalls by etching.

29. A method according to claim 21, wherein said substrate has a plurality of second segments and said depositing step b includes depositing said conformal layer atop said plurality of second segments.

30. A method of making a mask that is compensated to allow for optimized images of patterns thereon to be formed on a photosensitive substrate, comprising the steps of:

a. providing a substrate transparent to light of a first wavelength and having an upper surface on which is formed (i) a first segment having first sidewalls and (ii) a second segment having second sidewalls;

b. depositing a conformal layer so as to conformally cover said first segment and said second segment;

c. removing portions of said conformal layer so as to provide first spacers adjacent said first sidewalls and second spacers adjacent said second sidewalls; and d. removing said first spacers from said first sidewalls.

31. A method according to claim 30, wherein said step c comprises the steps of depositing a photoresist layer atop said conformal layer, selectively exposing said photoresist layer, and selectively developing said photoresist layer so as to form a photoresist cap layer atop said first and second sidewalls.

32. A method according to claim 31, further wherein step c includes the step of etching away portions of said conformal layer not covered by said photoresist cap layer so as to provide said first spacers and said second spacers.

33. A method according to claim 30, wherein said conformal layer is selected from the group consisting of molybdenum silicide, carbon and chromium.

34. A method according to claim 30, wherein said conformal layer has a thickness between 50 Å and 400 Å.

35. A method according to claim 31, wherein said photoresist layer has a thickness between 1000 Å and 20,000 Å.

36. A method according to claim 30, wherein said second spacers extend a distance d', as measured at a base of said first spacers, from adjacent second sidewalls, and said conformal layer has a thickness X, wherein said distance d' ranges from X to that distance between said second sidewall with respect to which said distance d' is measured and that one of said first sidewalls most proximate said second sidewall.

37. A method according to claim 30, wherein said step d includes the steps of providing a photoresist cap layer atop said second sidewalls and removing said spacers adjacent said first sidewalls by etching.

38. A method according to claim 30, wherein said substrate has a plurality of second segments and said depositing step b includes depositing said conformal layer atop said plurality of second segments.

39. A mask compensated for optimized imaging of first and second patterns, said mask comprising:

a. an upper surface having first patterns, each comprising a first segment having first sidewalls, and second patterns, each comprising a second segment, each having second sidewalls; and b. a partial conformal layer covering said first segment and extending outwardly along said upper surface a distance d from said first sidewalls.

40. A mask according to claim 39, wherein said first segment is isolated and said second segment is nested with other second segments.

41. A mask according to claim 39, wherein said second segment is isolated and said first segment is nested with other first segments.

42. A mask according to claim 39, wherein said partial conformal layer has a thickness X and said distance d ranges from X to that distance between said first sidewall with respect to which said distance d is measured and that second sidewall most proximate said first sidewall.

43. A mask according to claim 39, wherein said partial conformal layer is partially transmitting to light of a first wavelength.

44. A mask according to claim 39, wherein said partial conformal layer is made from a material selected from the group consisting of molybdenum silicide, carbon and chromium.

45. A mask according to claim 39, wherein said partial conformal layer has a thickness between 50 Å and 400 Å.

46. A mask compensated for optimizing imaging of first and second patterns, said mask comprising:

a. an upper surface having first patterns, each comprising a first segment having first sidewalls, and second patterns, each comprising a second segment having second sidewalls; and b. spacers adjacent said first sidewalls of said first segments and extending a distance d' from said first sidewalls of said first segment.

47. A mask according to claim 46, wherein each of said spacers has a base and a thickness X at said base and said distance d' ranges from X to that distance between said first sidewall with respect to which said distance d' is measured and that second sidewall most proximate said first sidewall.

48. A mask according to claim 46, wherein each of said spacers is partially transmitting to light of a first wavelength.

49. A mask according to claim 46, wherein each of said spacers is made from a material selected from the group consisting of molybdenum silicide, carbon and chromium.

50. A mask according to claim 46, wherein each of said spacers has a base and a thickness at said base between 50 Å and 400 Å.

51. A mask according to claim 46, wherein said first segment is isolated and said second segment is nested with other second segments.

52. A mask according to claim 46, wherein said second segment is isolated and said first segment is nested with other first segments.

* * * * *